Figure 1:
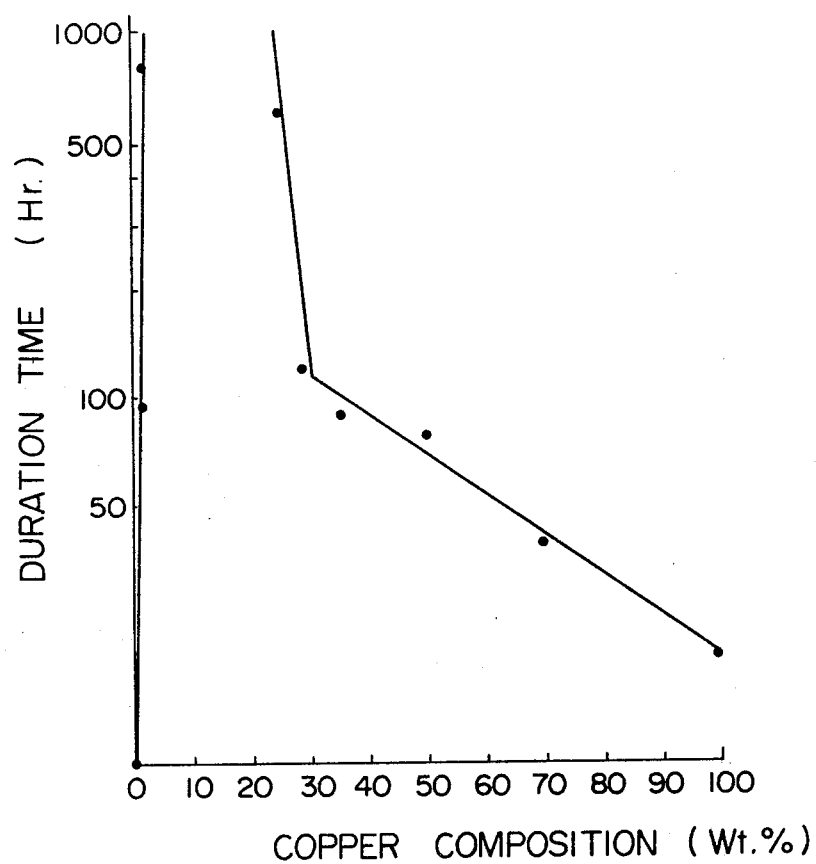

United States Patent [19]

Chiba et al.

[11] 4,166,876
[45] Sep. 4, 1979

[54] TRANSPARENT, ELECTRICALLY CONDUCTIVE LAMINATED STRUCTURE AND PROCESS FOR PRODUCTION THEREOF

[75] Inventors: Kiyoshi Chiba, Niiza; Kunio Itoh, Hino; Yuji Mitani, Hino; Utami Yonemura, Hino; Shigenobu Sobajima, Hachioji, all of Japan

[73] Assignee: Teijin Limited, Japan

[21] Appl. No.: 889,450

[22] Filed: Mar. 23, 1978

[30] Foreign Application Priority Data

Mar. 28, 1977 [JP] Japan .................................. 52-34275
Apr. 15, 1977 [JP] Japan .................................. 52-042569
Dec. 21, 1977 [JP] Japan .................................. 52-152955

[51] Int. Cl.$^2$ ..................... B32B 7/02; B32B 27/36; B32B 15/04
[52] U.S. Cl. ..................... 428/215; 427/108; 427/126; 427/164; 427/166; 427/374 R; 427/407 G; 427/419 B; 427/404; 428/216; 428/411; 428/412; 428/421; 428/425; 428/480; 428/523; 428/539; 428/472; 428/470; 428/474; 428/477
[58] Field of Search ............... 428/470, 472, 480, 216, 428/215, 411, 412, 523, 421, 477.7, 425, 473.5, 539; 427/109, 108, 126, 164, 166, 407 G, 419 B, 404, 374 R

[56] References Cited

U.S. PATENT DOCUMENTS

| | | | |
|---|---|---|---|
| 3,080,266 | 3/1963 | Haslam | 428/470 |
| 3,698,946 | 10/1972 | Kaspaul | 428/472 |
| 3,706,589 | 12/1972 | Fukuda | 428/472 |
| 3,962,488 | 6/1976 | Gillery | 427/109 |
| 4,017,661 | 4/1977 | Gillery | 428/472 |
| 4,020,389 | 4/1977 | Dickson | 427/66 |

FOREIGN PATENT DOCUMENTS 840513 4/1970 Canada .

Primary Examiner—Ellis P. Robinson
Attorney, Agent, or Firm—Wenderoth, Lind & Ponack

[57] ABSTRACT

A transparent, electrically conductive laminated structure composed of
(A) a transparent solid substrate,
(B) a thin layer of an oxide of titanium being contacted with the said substrate (A),
(C) a thin layer of an electrically conductive metal being contacted with the said layer (B),
(D) a thin layer of an oxide of titanium being contacted with the said layer (C), and
(E) optionally, a transparent top layer being contacted with the said layer (D)

characterized in that
(i) the said substrate (A) is a film-forming synthetic resin layer and
(ii) the said layer (B) is a layer of an oxide of titanium derived from a layer of an organic titanium compound and contains organic residual moieties of the said organic titanium compound;

and a process for the production of the same.

11 Claims, 1 Drawing Figure

TRANSPARENT, ELECTRICALLY CONDUCTIVE LAMINATED STRUCTURE AND PROCESS FOR PRODUCTION THEREOF

The present invention relates to a transparent, electrically conductive laminated (or composite) structure provided with good optical transparency and electrical conductivity and further excellent optically selective transparency with an excellent affinity, and bonding strength, in particular, for a transparent solid substrate of a film-forming synthetic resin capable of providing commercially with much ease as well as in low costs in good quality reproducibility.

More particularly, it relates to a transparent, electrically conductive laminated (or composite) structure characterized in that the said transparent, solid substrate is a film-forming synthetic resin layer, such as polyester resin layer, a thin layer of an oxide of titanium formed in contact with the said substrate being a layer derived from a layer of an organic titanium compound and containing organic residual moieties of the organic titanium compound of the said layer of the organic titanium compound.

Conventionally, a transparent, electrically conductive laminated structure is known and utilized in a widespread field, and it is a structure which is expected to be utilized in new fields. The structure of this kind is employed in usages utilizing its electroconductivity. For instance, it is widely used in usages in the field of electronics and electricity, such as electrodes for liquid crystal display, electrodes for electroluminescence, electrodes for photoconductive sensitive substances, antistatic layer, heating elements and so on. Further, the similar structure having optically selective transparency is widely used in the field of utilizing solar energy as window, collector and so on.

Furthermore, with information-oriented society making headway, developments have been made of solid displays, such as electroluminescence display, liquid crystal display, plasma display, ferroelectric substance display, taking the place of conventionally-used Braun tubes. Transparent electrodes are required for such solid displays. New electrooptical elements and recording materials utilizing interaction or interchange between electrical signals and light signals are going to play the leading part in the future information dealing techniques, but as part of constituents of these electrooptical materials are required those materials which are provided with a combination of transparency and electroconductivity. Apart from information materials, window glass with a transparent, electrically conductive film is required as defrost window glass in traffic means such as automobiles and aircraft.

On the other hand, in electro-insulating objects, such as high polymer shaped articles, the generation of static electricity is often a cause for serious hazards. For its prevention attempts are made, for instance, to fabricate by incorporating into high polymer powder of electroconductors such as metals and carbon, but it inevitably results in coloring, opacification or lowering of mechanical characteristics. However, it is an excellent process as an anti-static process to provide transparent, electrically conductive film on the surface of electro-insulating shaped article of high polymer or the like.

Further, selectively transparent film is transparent with respect to light in the visible region, but shows reflectivity with respect to infrared ray (including near infrared ray). Because of this it is valuable as transparent heat-insulating film. Therefore, it could be used in solar energy collector (water heater), solar heat power generation, greenhouse, building windows and so forth. In modern buildings, in particular, utilization of solar energy through windows accounting for great proportions of wall surfaces and functions as transparent heat-insulating windows preventing energy radiation will more and more increase in their significance in future. Moreover, its significance is great as film in use for greenhouses required for the raising of vegetables, citrus fruits and the like, for instance.

Thus, transparent, electrically conductive film is important in terms of electronics, utilization of solar energy and transparent heat insulator. It has been desired in the trade circle concerned to provide a homogeneous and highly effective film commercially in low costs as well in quantities in good quality reproducibility, but it has been practically difficult to provide a transparent, electrically conductive laminated structure which can fully meet these demands.

Conventionally, many proposals have been made for the transparent, electrically conductive or optically selectively transparent laminated structure, and various combinations are recommended for the kind of the substrate, the kind of the oxide in the layer of the oxide of titanium formed on the said substrate and means for forming the said layer; the kind of the metal in the layer of the electrically conductive metal formed in the said layer of the oxide of titanium and means for forming the said layer; kind of the layer of the oxide of titanium formed on the said layer of the electrically conductive metal and means for forming the said layer and so forth.

With such conventionally-proposed structures, in many cases, the structure which is used in common is composed of (A)–(E) below:

(A) A transparent, solid substrate - a layer such as glass, quartz, ceramics, synthetic resins and so on, (B) a thin layer of an oxide of titanium being contacted with the said substrate (A), (C) a thin layer of an electrically conductive metal being contacted with the said layer (B), the said thin layer using, as the metal, Ag, Au, Cu, Pd, Sn and the like, for instance, (D) a thin layer of an oxide of titanium being contacted with the said layer (C), and (E) optionally, a transparent top layer being contacted with the said layer (D).

For instance, there is proposed in U.S. Pat. No. 3,698,946 a laminated (or composite) structure composed of a first transparent layer of titanium monoxide vacuum-deposited on a transparent solid substrate, such as glass, quartz and polyester, a second transparent layer of a metal selected from the group consisting of Cu, Ag, Au, Pd, Sn and Au-Pd alloys vacuum-deposited on the said first layer and a third transparent layer of titanium monoxide vacuum-deposited on the said second layer.

U.S. Pat. No. 3,962,488 and U.S. Pat. No. 4,017,661, a divisional application therefrom, propose to use, as the said layer of titanium oxide, in particular, a layer of titanium oxide represented by the formula $TiO_x$ wherein x is $1.3 \leq X \leq 1.7$ in the same laminated structure as the above.

There are made proposals for similar techniques provided with various specifying requirements, respectively, in Japanese Laid-Open Patent Application No. 51-66841 (corresponding to U.S. patent application Ser.

No. 498,160), U.S. Pat. No. 4,020,389, Japanese Patent Publication Application No. 47-6315 (corresponding to British Pat. No. 130762 and French Pat. No. 2043002) and so forth.

What the above cited conventional proposals have in common is to usually form the layer of titanium oxide by means of vacuum-depositing. As other means illustrations are made of a heat evaporation process, chemical vapor-deposition means and so forth in the said Japanese Laid-Open Patent Application No. 51-66841, but it lacks in specific disclosure showing the practice by such means.

As another proposal for the similar structure is known Japanese Patent Publication No. 48-27726 (corresponding Belgian Pat. No. 693528; Canadian Pat. No. 840513; Dutch Laid-Open Patent Application No. 67-4581). In this proposal as well, the layer of titanium oxide is formed by the customarily-used vacuum-depositing means, but there is shown an example in which the titanium oxide layer is formed by means of the wet process (Example VIII of the above Canadian Pat. No. 840513). In this example, a gold layer 175 Å in thickness is deposited between two titanium oxide layers 117 and 310 Å in thickness, respectively, for the preparation of "anti-heat" windows with a gray reflection tint. In this example, the titanium oxide layers are deposited from a solution of titanium ethylate containing 30 gr. of titanium oxide per liter of ethyl alcohol. The surface of the sheet to be covered by the layers is first coated with this solution, dried for 10 minutes at a temperature of 100° C. and finally fired at a temperature of 500° C. That is, in this example, the thin layer of titanium oxide is formed by converting titanium ethylate into titanium oxide through heat treatment being effected finally at 500° C. For this reason there could never be left over any organic residual moieties derived from titanium ethylate used in the said formed layer.

As above explained in summary of prior art techniques, in this technical field, transparent, electrically conductive laminated structures with either of the said thin layers (B), (C) and (D) being an organic moiety-containing layer remained totally unknown. No one could predict any possible merits arising from containing organic moieties. Consequently, there were none of ideas nor proposals in which to attempt to utilize the organic moiety-containing layer as the said thin layer (B) of titanium oxide being contacted with the said substrate (A).

The instant inventors studied to provide a laminated (or composite) structure consisting of a transparent solid substrate (A) of a film-forming synthetic resin, a thin layer (B) of an oxide of titanium being formed on and contacted with the said substrate (A), a thin layer (C) of an electrically conductive metal being contacted with the said layer (B), a thin layer (D) of an oxide of titanium being contacted with the said layer (C) and optionally, a transparent top layer being contacted with the said layer (D), and a laminated structure provided with optically selective transparency together with optical transparency and electrical conductivity with an excellent affinity, particularly bonding strength, for the substrate (A) of the resin, in particular.

As the result of this it was found that the critically important requirement for the electrically conductive and optically selective transparent laminated structure whose substrate (A) being a film-forming synthetic resin layer designed for the provision of a satisfactory laminated structure should be the said layer (B) being a layer of an oxide of titanium derived from a layer of an organic titanium compound, and said layer (B) containing organic residual moieties of the said organic titanium compound.

In the conventional proposals it was regarded as necessary for the said layer (B) to be a thin layer of an inorganic oxide of titanium, and no one could expect any possible merits from the technical concept of attempting to incorporate the organic moiety into the said layer (B) and from the incorporation in the said layer (B) of the organic moiety. In fact, as introduced with reference to prior art of the above cited Japanese Patent Application No. 48-27726, for instance, even if utilization was made of the organic titanium compound in the formation of the said layer (B), conversion of titanium oxide was effected at such conditions as to keep the organic moiety from being left over, and all that was formed by vacuum-depositing or similar means having been best utilized was a layer in which the organic moiety was absent in substance. It was discovered, however, that by making the said layer (B) a layer of an oxide of titanium derived from a layer of an organic titanium compound, said layer containing organic residual moieties of the said organic titanium compound the affinity for the substrate (A) of film-forming synthetic resin could be improved to advantage, the bonding strength with the said substrate being markedly improved with improvement in the transparency of the laminated structure.

With the transparent, electrically conductive laminated structure, transparency of the laminated structure is produced by the multi-interference effect of light passing through the respective constituent layers. Consequently, irregularity of the contact surfaces of the respective layers, viz., delicately irregular variations in the respective film surfaces will directly affect the transparency of the laminated structure. Particulars for this reason remain unknown, but it was found that by using a layer which is a layer of an oxide of titanium derived from a layer of an organic titanium compound and which contains organic residual moieties of the said organic titanium compound bonding strength with the substrate (A) could be remarkably improved and at the same time, inconvenient influences on the multi-interference effect of the said irregularity could be avoided, in consequence of which excellent transparency could be insured.

Furthermore, the said layer (B) can be formed in low costs by such easy means as coating the surface of the substrate (A) with a solution of an organic titanium compound in solvent and drying in such a manner as to leave part of organic moieties of the titanium compound under such hydrolysis conditions as to enable the said organic titanium compound in the said coated layer to transform itself into an oxide of titanium. It was found that under such circumstances there could be avoided various such demerits as requiring complicated operations and expensive apparatus, being slow in the rate at which to form the layer and involving difficulty in control over the composition and film thickness.

Therefore, the present invention aims at providing a transparent, electrically conductive laminated structure provided with good optical transparency as well as electrical conductivity and further optically selective transparency with an excellent affinity, and bonding strength, in particular, for a transparent solid substrate of a film-forming synthetic resin capable of providing commercially with much ease as well as in low costs in good quality reproducibility, and a process for the production of the same.

The aforesaid object and many other objects of the present invention as well as advantages gained will be made more clear from the description given below:

The transparent, electrically conductive laminated structure of the present invention is composed of (i) a transparent solid substrate of a film-forming synthetic resin, (ii) a thin layer of an oxide of titanium being contacted with the said substrate (i), the said layer being derived from a layer of an organic titanium compound and containing organic residual moieties of the said organic titanium compound, (iii) a thin layer of an electrically conductive metal being connected with the said layer (ii), (iv) a thin layer of an oxide of titanium being contacted with the said layer (iii), the said layer (iv) preferably being derived from a layer of an organic titanium compound and containing organic residual moieties of the said organic titanium compound, and (v) optionally, a transparent top layer being contacted with the said layer (iv).

The above structure of the present invention can be prepared in good quality reproducibility as well as in low costs at an excellent production rate by means of commercially easy operations and simple apparatus by following the manufacture procedures comprising the steps of (1)–(5) below:

(1) A step of coating the surface of a transparent solid substrate of a film-forming synthetic resin with a solution of an organic titanium compound in solvent, (2) a step of drying the coated layer obtained in the said step (1) in such a manner as to leave part of organic moieties of the said organic titanium compound under hydrolysis conditions of the said organic titanium compound in the said coated layer, (3) a step of forming a thin layer of an electrically conductive metal on the said dried layer of oxide of titanium containing organic residual moieties of the organic titanium compound formed in the said step (2), (4) a step of forming a layer of an oxide of titanium on the said thin layer of electrically conductive metal formed in the step (3), the said step involving forming the layer by similar means to that of the said steps (1) and (2), and (5) optionally, a step of forming a transparent top layer on the layer obtained in the said step (4).

In the transparent, electrically conductive laminated structure of the present invention, the organic residual moiety content of the said layer (ii), and preferably of the said layers (ii) and (iv), should preferably be 0.1–30% by weight, and more preferably 1.0–10%, based on the organic groups contained in the layer of the organic titanium compound.

In the present invention, the said organic residual moiety content is measured and determined in the following manner.

The procedure for measurement and determination of the organic residual moiety of the organic titanium compound contained in the layer of oxide of titanium derived from the layer of organic titanium compound:

A solution was prepared by mixing water and methanol in a weight ratio of 1:1 and dissolving potassium hydroxide in a concentration of 10% by weight. A sample laminate was cut into square-shaped small pieces each side measuring about 2 mm, and these pieces were added to the solution so that their amount reached 20 cm$^2$/ml. They were immersed in the solution for 24 hours at room temperature to extract the organic components. The amount of the organic components was obtained from the quantitative determination of the ions which was performed by mass fragmentgraphy on a gas chromatographic mass analyzer (Model LKB-9000 made by Shimadzu Seisakusho) using a glass column, 3 mm in diameter and 3 m in length, packed with Chromosorb W (60–80 mesh) having 30 parts by weight of PEG-20 attached to it.

For this determination, in the case of using tetrabutyl titanate, there is weighed the component having the mass number corresponding to butyl, but in the case of using, as solvent, solvents of the alcohol series at the time of coating, there is the possibility of ester-interchange, and because of this, the component with the mass number corresponding to the alkyl component of the alcohol used as solvent is also calculated and the sum of the both is set as the amount of the organic residual component in the titanium compound. Furthermore, the balance of the organic groups was determined with titanium oxide density set at 2.5 g/cm$^3$ by using the organic group concentration determined by the mass fragmentgraphy and the titanium oxide film thickness determined by the fluorescent X-ray method.

The film-forming synthetic resin layer (i) used as the transparent solid substrate in the present invention can be formed of any optional film-forming synthetic resins capable of standing the drying temperatures used in drying the layer of the organic titanium compound coated on the said layer (i) in such a manner as to leave part of organic moieties of the said component under hydrolysis conditions of the said organic titanium compound in the said layer.

As examples of such film-forming synthetic resins can be mentioned, for instance, thermoplastic resins such as resins of the polyester series such as polyethylene terephthalate resin, polyethylene naphthalate resin, polybutylene terephthalate resin and polycarbonate resin; acrylic resins; polystyrene resin; resins of the polyolefin series such as polyethylene resin and polypropylene resin; polyamide resin; polyvinyl fluoride resin and their blend resins and solvent soluble type film-forming resins such as polyvinyl alcohol, polyacrylonitrile, polyurethane, aromatic polyamide, polyimide resin and so on.

The above-illustrated film-forming synthetic resins will not be confined to homopolymers and may be copolymers or further blend mixtures or laminates. Such resins can take any optional forms. They can assume film, sheet, plate, rod, pipe, block, filament and any other optional forms. In the present invention, however, they should preferably assume a film or sheet-like polyester form. Particularly, what is used to advantage is a polyester film or sheet which is preferably 80% or more in the visible light transparency and preferably 6–250 μm, and more preferably 20–200 μm, in film thickness. The utilization of polyester film or sheet, such as polyalkylene terephthalate or polyalkylene naphthalate, is particularly preferred. Oriented polyester film or sheet is preferred for such polyester film or sheet. Particularly preferred is a polyester film or sheet such as at least monoaxially oriented, and preferably biaxially oriented, polyethylene terephthalate with the refractive index in the oriented direction of 1.57–1.58, refractive index in the thickness direction of 1.48–1.57 and density of 1.340–1.390 g/cm$^3$.

In the laminated structure of the present invention, there are provided a thin layer (ii) of a oxide of titanium derived from a layer of an organic titanium compound in contact with the said substrate (i), said thin layer containing organic residual moieties of the said organic titanium compound.

The said layer (ii) can be formed by coating the surface of the said substrate (i) with a solution of an organic titanium compound in solvent and drying the said layer in such a manner as to leave part of organic moieties of the organic titanium compound at such conditions as to convert the said organic titanium compound in the coated layer so formed into oxide of titanium on hydrolysis.

As the said organic titanium compound alkyl titanates are preferably used, and for instance, there are preferably used alkyl titanates represented by the following formula:

$$Ti_l O_m R_n$$

wherein R stands for an alkyl group, preferably $C_1$–$C_{20}$ alkyl and more preferably $C_2$–$C_{11}$ alkyl, and l, m and n stand for positive numbers.

The alkyl titanates of the above formula wherein
$m = 4 + (l-1) \times 3$,
$n = 4 + (l-1) \times 2$ and
$l = 1$–$30$
are preferably used in terms of the above coating layer-forming adaptability. The value of "l" need not be unitary, but may have a distribution. Particularly, alkyl titanate showing such a distribution as the distribution of the values of "l" having the maximum value as 15 or less is preferred in the coating solution viscosity and in the hydrolyzability. Further, alkyl titanates represented by the above formula wherein R stands for $C_2$–$C_{11}$ alkyl are preferably used in terms of film-forming operations, such as easiness with which to coat, further of the hydrolytic rate, of mechanical characteristics as well as transparency of film obtained. In this connection, mixtures of more than two members of the said alkyl titanates may be used. The said alkyl titanate is dissolved in organic solvent into a solution, coated on the surface of the substrate (i), hydrolyzed in the presence of atmospheric moisture and dealkylhydrooxidated by the subsequent condensation reaction. By choosing coating conditions alkyl titanate comes close to titanium oxide.

In the present invention, as mentioned earlier, the said layer (ii) of oxide of titanium should contain preferably 0.1–30% by weight, and more preferably 1.0–10% by weight, of organic residual moieties based on organic groups contained in the organic titanium compound in the said layer of the organic titanium compound according to the measurement and determination method as defined in the present invention. By drying treatment under such conditions as to leave organic residual moieties oxide of titanium converted from alkyl titanate occupies preferably about 70– about 99.9% by weight and more preferably about 90–about 99.0% by weight based on the weight of the layer (ii).

In the present invention, however, drying treatment should not be effected at such conditions as to lose substantially the whole organic groups of the organic titanium compound in the layer of the organic titanium compound from which to derive the layer (ii). The drying treatment conditions for converting alkyl titanate into oxide of titanium under such conditions as to leave part of organic moieties of alkyl titanate can be suitably modified according to the kind of the layer of the organic titanium compound, heating conditions, thickness of the said layer and so forth. There are employed, for instance, such conditions as to dry for about 10 seconds–about 10 hours, more preferably, about 60 seconds–about 600 seconds, for instance, at temperature conditions in the order, for instance, of about 50°–about 200° C., more preferably about 90°–about 150°

As such drying means illustrations can be made of such means as hot air oven, infrared ray heater and so on.

As examples of alkyl titanates expressed by the above formula can be listed tetrabutyl titanate, tetraethyl titanate, tetrapropyl titanate, tetrastearyl titanate, tetra 2-ethylhexyl titanate, diisopropoxytitanium-bis-acetylacetonate and so forth, and particularly, tetrabutyl titanate and tetrapropyl titanate are preferably used. These alkyl titanates can be used as such, but those ones which were precondensated into a dimer, tetramer or decamer form can be preferably used.

Furthermore, these alkyl titanates may be used stabilized with acetyl acetone or something like that.

As the organic solvent generally used in the coating layer-formation by alkyl titanates are preferred those solvents which are capable of fully dissolving alkyl titanates used and which have an affinity for the surface of the substrate and which are easy to coat and easy to dry after coating. As such organic solvents can be listed organic solvents of the hydrocarbon series, of the alcohol series, of the ether series, of the ester series, of the carboxylic acid series and of the halogen-substituted hydrocarbon series, such as hexane, cyclohexane, heptane, octane, methylcyclohexane, toluene, benzene, xylene, octene, nonene, solvent naphtha, methanol, ethanol, isopropanol, butanol, pentanol, cyclohexanol, methylcyclohexanol, phenol, cresol, ethyl ether, propyl ether, tetrahydrofuran, dioxane, acetone, cyclohexanone, methyl ethyl ketone, methylisobutylketone, methylacetate, ethylacetate, propylacetate, butylacetate, ethylpropionate, methyl benzoate, glacial acetic acid, chloroform, carbon tetrachloride, trichlene, trichloroethane, chlorobenzene, dibromoethane, methyl cellosolve, cellosolve, cellosolve acetate and so on. Particularly, isopropanol, butanol, normal-hexane, toluene and the like are preferably used. These organic solvents can be optionally used either alone or in mixtures of more than two members. Hydrated solvents may also be used as the case may be.

The preparation of the solvent solution for the layer of the organic titanium compound designed to form the thin layer (ii) of oxide of titanium derived from the layer of the organic titanium compound of the present invention can be effected with ease by dissolving the organic titanium compound in the above-illustrated organic solvents. On this occasion, if desired, application of heat is allowed for dissolving in such a range not as to impair the intended effect of the present invention of leaving part of organic residual moieties, and it is also allowable to add some amounts of other resin components soluble in the said organic solvents for the purpose of improving properties of coated film such as adhesiveness, refractive index, color tone, hardness and so on. As such resin components can be listed solvent-soluble type resins such as silicon type resins, arcylic resins, epoxy resins, polyurethane resins and so on. The concentration of the said organic solvent solution of alkyl titanate (coating solution) is modifiable in a suitable way, but it could be better adjusted to the concentration of 0.1–30% by weight, preferably 0.5–10% by weight, and particularly preferably 1–7.5% by weight, for the provision of a thin film layer in the order of several hundred Angstroms in film thickness, in particular.

Any known optional coating means can be used for coating means itself of coating the substrate of film-forming synthetic resin with the said solvent solution of organic titanium compound in the present invention.

In the case of coating the surface of shaped article with this solution, besides the immersion process, spray process, spinner process and the like, such processes as making use of coating machines at large, viz., those processes which involve the using of gravure coater, Meyer bar coater, reverse roll coater and so forth are available. In the case, for instance, of coating a smooth solid substrate, such as film, sheet and so on, the using of gravure coater and of Meyer bar coater is preferred in terms of control and uniformity of film thickness. Whereas in the case of coating an uneven solid substrate it is the spray process that is preferably used. Simultaneously with or after coating solution solvent is dried at temperatures above room temperature.

This drying, as mentioned earlier, should be effected in such a manner as to leave part of organic residual moieties derived from the organic titanium compound in the layer of oxide of titanium derived from the layer of organic titanium compound which is obtained by drying.

In the present invention, by leaving part of such organic residual moieties and particularly preferably by leaving the said moieties in such a manner as to reach the said content, bondability with the solid substrate (i) and further, bondability with the thin layer (iii) of the electrically conductive metal formed on the surface of the layer (ii) of oxide of titanium formed, could be improved, and occurrence of adverse influences exerted on the transparency of the laminated structure of irregularity on the contact surfaces between the respective layers of the laminated structure could be overcome. Thus, it is possible to obtain in good quality reproducibility transparent, electrically conductive film or selectively transparent film excellent in transparency and in surface conductivity extending over the widespread wavelength region.

In the present invention, since the thin layer (ii) of oxide of titanium derived from the layer of organic titanium compound contains part of said organic residual moieties, the refractive index of the said layer is lower than that of the titanium oxide layer obtained by conventional customarily-used sputtering or vacuum evaporation process, and it is in the order of 1.6-2.2 in the visible region. Because of this, the laminate of the present invention gains following merits. (a) It is uniform in the transparency extending over a wide area. (b) It is excellent in the adhesiveness with shaped article. (c) It is high in the transparency extending over a wide wavelength area in the visible region, and the like.

Furthermore, the layer (ii) of oxide of titanium containing organic residual moieties of the organic titanium compound, as mentioned above, can be formed by coating and drying means. As compared with the conventional customarily used sputtering, vacuum evaporation means, or other similar means, this can achieve such advantages as (d) fast in the layer-forming rate, easy, simple and low in costs in the layer-forming operations and apparatus, easy to control the composition of the layer and film thickness and (e) excellent in the flexibility that it is hard to break down against distortion by bending.

In the present invention, film thickness of the said thin layer (ii) can be optionally changed in a suitable way, but it should preferably be 50–1000 Å, more preferably 200–500 Å and much more preferably 200–400 Å.

In the present invention, the thin layer (iii) of the electrically conductive metal is formed on the thin layer (ii) obtained as the above. As such electrically conductive metals any metals or alloys which are less in the absorption loss in the visible region are available. For instance, it is at least one member of metals selected from the group consisting of silver, gold, copper, aluminum, nickel and palladium that is preferably used. Particularly, copper, silver and palladium are preferred for obtaining highly transparent, electrically conductive film (iii). Furthermore, gold, silver and copper, and silver, in particular, are preferable for obtaining the layer (iii) provided with selective transparency with high infrared reflectivity.

No limitations are imposed on the thickness of the metal thin layer (iii) as long as it is provided with characteristics required for the transparent, electrically conductive layer or selectively transparent layer, but it is necessary to have continuity at least in a certain extent of region for its showing infrared reflective power or electroconductivity. As thickness of film, shifting from the island structure to the continuous structure it should be about 50 Å or more and preferably 600 Å or less and more preferably 500 Å or less in terms of transparency with respect to solar energy. The thinner the film thickness of the metal thin film layer, the wider the transparent region is extended. Film thickness of 200 Å or less, and further 180 Å or less, is preferred for increasing transparency. It is film thickness of 100 Å or more that is preferred for the film layer to show its electroconductivity or infrared reflectivity to a full extent.

As the process by which to form the metal thin film layer (iii) it is possible to use, for instance, either of the vacuum evaporation process, cathode sputtering process, plasma-gum spray process, gas phase plating process, chemical plating process, electroplating process and chemical coating process, or combinations thereof, but in the laminate when using the shaped article substrate, in the case of the surface of sheet, film and so forth, as the substrate, being smooth, the vacuum evaporation process, in particular, is suited in terms of uniformity of the formed thin layer (iii), readiness with which to produce the film layer and film-forming rate. Unlike in the case of physical deposition of the compound as with the said layer (ii) of titanium oxide, the physical deposition of the metal does not form any technical and commercial bar.

In the present invention, it is particularly preferred that the said thin layer (iii) of the electrically conductive metal being contacted with the thin layer (ii) should be a unitary metal thin layer film in which silver and copper are made to coexist. By the unitary metal thin film layer referred to here is meant a metal thin film in which silver atoms and copper atoms coexist in substance to form a single layer without silver and copper forming their respectively independent layers. In some cases, it would be completely uniform, but in other cases, it would be non-uniform to some extent. It should however exist as a single layer, to say the least of it.

In this preferred embodiment, it is possible to overcome to advantage degrading trends with the thin layer (iii) consisting entirely of silver which are readily caused in the case of being subject to intense irradiation of sunlight and the like in the air, in the case of being subject to irradiation over a prolonged period of time even with relatively weak light, or in the case of being heated at high temperatures in the air, such as being exposed to reactive gas atmosphere of hydrogen sulfide, sulfur dioxide and the like. For the cause of this degradation, according to the instant inventors' study, it is found that the said degradation is caused due mainly to the migration of silver toward the layer (D) in the case of using the thin layer (iii) consisting entirely of silver. In the preferred embodiment of the present invention, therefore, the layer composed of silver and copper with copper coexisting is utilized for the said thin layer (iii). The new technical concept discovered by the instant inventors as the above will be explained in more detail as follows.

In The FIGURE, one example of changing of durability to light is indicated in terms of duration time in the case of using silver as the thin layer (iii) of the electrically conductive metal and increasing the amount of copper being made to coexist with this silver. The laminated structure used has the following composition:

Substrate (i): Biaxially stretched polyethylene terephthalate film 75 μm in thickness whose transparency is 86%.

Layer (ii): Oxide of titanium 300 Å in thickness with the organic residual moiety content of 5.5% by weight.

Layer (iii): 160 Å in thickness.

Layer (iv): Oxide of titanium 300 Å in thickness with the organic residual moiety content of 5.5% by weight.

Light resistance was tested by means of Xenon weather-ometer (Model XW-1of Toyo Rika Kogyo Company) on the respective samples of the above laminated structure where the amount of copper in the layer (iii) varied. The changing of light resistance was traced by the changing of infrared areflectivity, and it was determined by setting as the degrading time those hours spent until the point of time when the refletivity reached 80% or less of the initial value. However, the polyester film face side was directed to the light source. Results were shown in FIG. 1.

As readily seen from the results of FIG. 1, it is notice in this example that in the case of using silver as the thin layer (iii) of the electrically conductive metal, it was when copper was made to coexist in the amount of about 1–about 30% by weight, particularly about 3 –about 25% by weight and more particularly about 5–about 20% by weight that the photo-degrading property was critically prevented, which produced the improvement of durability.

In one of the preferred embodiment of the present invention, therefore, it is recommended to use, as a metal of the thin layer (iii), a thin layer of Ag in which copper is made to coexist in the amount of about 1— about 30% by weight, preferably about 3–about 25% by weight, and more preferably about 5–about 20% by weight. On this occasion. for instance, gold, aluminum, nickel, palladium, platinum, indium, tin, cadmium, germanium, zinc and so forth, may coexist in such minor amounts not as to impair the improvement of durability as the above.

Sputtering processes using an alloy-target or multiple target are suited for the formation of the thin layer (iii) in the said preferred embodiment. Combinations of the multiple evaporant sources or alloy evaporant sources and electron beam heating process, radio frequency induction heating process, resistance heating process, flash vapor-evaporation process and so forth are preferred even in the vacuum-evaporation process.

In the present invention, there is further formed a thin layer (iv) of an oxide of titanium or the surface of the thin layer (iii) of the electrically conductive metal formed as the above.

This thin layer (iv) should preferably be the same layer as mentioned of the thin layer (ii) of oxide of titanium.

Only in terms of imoroving the bondability with the substrate (i), however, there is no difficulty with the thin layer oxide of titanium formed by other forming means. This latter thin layer of oxide of titanium is formed by following the well-known procedures such as vacuum evaporation, reactive vapor evaporation or sputtering of titanium metal or titanium oxide.

For the film thickness with the thin layer (iv) of oxide of titanium in the present invention illustrations can be made of the same film thickness as mentioned of the said layer (ii). In the case, in particular, of the thin layer (iv) being a layer of an oxide of titanium derived from a layer of an organic titanium compound and containing organic residual moieties, there are produced such merits as being greater in the contact angle with respect to water and being highr in the water repellency than with the thin layer of an oxide of titanium not containing organic residual moieties.

The laminate of the present invention may have (v) optionally, a transparent top layer being contacted with the layer (iv) in addition to the said layers (i), (ii), (iii) and (iv). That is, it is possible to provide a transparent top layer for improving the surface hardness, weatherability and the like.

As the material usable for the layer like that can be listed inorganic material such as silicon oxide, magnesium fluoride and so on, in addition to organic materials such as arcylic resins such as polymethylmethacrylate and so on; silicon resins such as polymer obtained from ethyl silicate and so on; polyester resin; melamine resin; fluorine-containing resin and so on. In the case, in particular, of improving weatherability or surface hardness it is acrylic resin or silicon resin that is preferably used.

As the means of forming such a transparent top layer can be mentioned following means. The layer of the organic material such as acrylic resin, polyester resin, melamine resin, fluorine-containing resin and so on can be formed by means of sprayer or coating machine by use of solvent, solution or emulsion, whereas the layer of the inorganic material such as silicon oxide, magnesium fluoride and so on can be formed by such general means as vacuum-evaporation, sputtering process and so on.

The laminate showing transparent electroconductivity, one of the objectives of the present invention, is 10% or more, and preferably 50% or more, in the visible light transparency and $10^8 \Omega$/square or less in the surface resistance.

By adjusting film thickness of the metal thin layer (iii), and of the titanium oxide thin layers (ii) and (iv), constituting the laminate of the present invention and their laminating process visible transparency, surface resistance and infrared reflectivity can be optionally altered. For instance:

(a) As the laminate having transparent conductivity usable for antistatic or photoconductive sensitive substance electrically conductive layer those ones whose visible light transparency is 75% or more and whose surface resistance is $10^4$–$10^8 \Omega$/ square are chosen.

(b) In the case of using as transparent electrodes for the solid displays of liquid crystal, electroluminescence and so forth there are chosen those ones whose visible light transparency is 60% or more and whose surface resistance is $10^5\Omega/$ square or less.

(c) As the heating unit such as defrost heater on the atomobile window and so on there are chosen those ones whose surface resistance is $10^2\Omega/$ square or less and whose visible light transparency is 65% or more.

(d) In the case of using as the selectively transparent film there are chosen those ones which were so adjusted as to reach 10% or more and preferably 55% or more in the visible light transparency and 60% or orer in the infrared reflectivity.

More preferably, those ones whose visible light transparency is 85% or more are used for the purpose of (a) above, those ones whose visible light transparency is 75% or more and whose surface resistance is $10^3\Omega/$ square or less are used for the purpose of (b), those ones whose visible light transparency is 75% or more and whose surface resistance is $50\Omega/$ square or less are used for the purpose of (c), and for the purpose of (d) there is provided a selectively transparent laminate by adjusting conditions in such a manner as to reach 65% or more in the visible light transparency and 75% or more in the infrared reflectivity.

The transparent, electrically conductive laminate used as the heat element for the purpose of (c) above is not always required to be surface conductive and it may be insulative in the outermost layer since the metal thin layer (iii) functions as the electroconductive layer. In this case, this insulating layer must be removed by means of etching and the like only in the portion from which to take the electrode.

Even in the case of using as the selectively transparent film for the purpose of (d) above, as is the case with the (c), the metal thin layer functions as the infrared reflective and electroconductive layer and so it is not always required to be surface conductive, but if it is surface conductive, it serves to prevent charging and is easy to take the electrode.

The organic residual moiety-containing titanium oxide thin layer (ii) or layers (ii) and (iv) constituting the laminate of the present invention contain the metal diffused from the metal thin layer (iii) and enhance the tunnel effect or insulation breaking effect, in consequence of which those layers conduct electricity better than the titanium oxide thin layer obtained by vaccum evaporation or sputtering process. Consequently, the trannsparent, electrically conductive laminate with the organic residual moiety-containing titanium oxide thin layer (iv) being disposed in the outermost layer shows surface conductivity and for instance, when the metal layer is earthed, this transparent, electrically conductive laminate cannot be charged by means of corona discharge and so forth. Consequently, the transparent, electrically conductive laminate having such surface conductivity is specifically valuable as antistatic layer or electrodes for solid displays of (a) and (b) above, in particular.

The laminated or composite structure of the present invention is used in transparent electrodes giving electrical energy and obtaining light energy, or giving light energy and obtaining electrical energy, or as an antistatic layer. The laminate provided with the layers (ii) –(iv) on the layer (i) with excellent selective transparency, in particular, is preferably used as the selectively transparent material for effectively utilizing sunlight and/or energy-saving material making use of its heat-insulating property. The laminate provided with the said layers (ii), (iii) and (iv) on the surface by using a colored transparent film or sheet (i) can impart electroconductivity without impairing the color of the shaped article and serves, for instance, to prevent the shaped article from being charged with static electricity. The laminate provided with the said layers (ii), (iii) and (iv) with excellent infrared reflectivity can impart infared reflectivity without impairing the color or design of the shaped article. Particularly, the laminate with the said layers (ii), (iii) and (iv) with excellent selective transparency provided on the surface of the shaped article (i) tinctured in such a color as absorbing sunlight well, for example, blacj and the like, can absorb sunlight well and can be effectively used as material with selective absorbability and less heat radiation.

Particularly, if such a selectively absorbable material is used as heat absorber in the solar heat-water heater for obtaining warm water by making use of sunlight, efficiency for the utilizing of solar heat is markedly enhanced.

For instance, the laminate with excellent selective transparency of the present invention being formed on the surface of the shaped article passing through water like piping whose surface is so colored as to well absorb sunlight can be effectively used as solar heat collector with such selective absorption effect.

Particularly, the laminate of the present invention with a transparent high polymer sheet or film using as the substrate gains such merits as light weight, enriched with flexibility, hard to rupture and easy to fabricate. For instance, it is preferably used as the transparent electrode for the electroluminescence, transparent electrode for the photoconductive sensitive substances, heat-insulating film for preventing heat loss from the window provided on the window glass in the building, or near the windows. By the substrate being a sheet or film it is made possible to conduct the continuous production wit readiness, to considerably enhance the production rate and to supply excellent material in quantities as well as in low costs. Commercial value produced by using such a subtrate is high.

The present invention will be explained here with reference to working example.

Unless otherwise specified, transparency is a value at a wavelength of 500 nm. For the infrared reflectivity a reflectivity-measuring device was mounted on Model EPI-II infrared spectrograph of Hitachi Ltd. and it was determined by setting at 100% the reflectivity of silver being vacuum-deposited sufficiently thick (about 3000 Å) on slide glass. The measurement was made at a wavelength of $10\mu$.

For the surface resistance the specimen was cut 1 cm wide and electrically conductive paint 5 mm wide was coated to the full width as intervals of 1 cm and it was determined by measuring resistance between the said electrically conductive coatings.

For the film thickness of the titanium oxide layer and of the metal layer there was drawn up in advance a calibration curve between the film thickness actually measured by means of multi-interference microscope and the count number of the fluorescent X-ray and it was determined from the count number of the fluorescent X-ray by using the calibration curve. In this connection, the film thickness of titanium oxide in the third layer (top layer) was calculated from the difference between the count number of titanium oxide in the first layer measured in advance and the total count number of titanium oxide.

EXAMPLE 1

There was formed on the film a laminate with transparent electrical conductivity and selective transparency by laminating on a biaxially-stretched polyethylene terephthalate film 75 μm in thickness whose transparency was 86% a titanium oxide thin layer 250 Å in thickness as a first layer, a silver thin layer 140 Å in thickness as a second layer and a titanium oxide thin layer 300 Å in thickness as a third layer.

The titanium oxide layers were each provided by coating by bar coater and heating at 110° C. for 5 minutes a solution comprising 3 parts of a tetramer of tetrabutyl titanate, 65 parts of isopropyl alcohol and 32 parts of normal hexane.

The silver layer was vacuum-deposited in a vacuum degree of $5 \times 10^{-5}$ Torr. The total content of isopropyl groups and butyl groups contained in the titanium oxide thin layers as the first and third layers was 7.5%. Film obtained showed transparency of 83%, surface resistance of 15 Ω/square and infrared reflectivity of 96%.

EXAMPLES 2-7

Transparent, electrically conductive and selective transparent film was obtained in the same way as in Example 1 except that the film thickness of the titanium oxide thin layers as the first and third layers was altered as indicated in Table 1. Characteristics of the film obtained were shown together.

Table 1

| Example | Film thickness in the first layer (Å) | Film thickness in the third layer (Å) | Transparency (%) | Infrared reflectivity (%) |
|---|---|---|---|---|
| 2 | 100 | 100 | 72 | 98 |
| 3 | 180 | 180 | 76 | 98 |
| 4 | 220 | 220 | 82 | 98 |
| 5 | 300 | 300 | 83 | 98 |
| 6 | 420 | 420 | 76 | 97 |
| 7 | 500 | 500 | 71 | 95 |

Table 2 below shows wavelengths at which transparency reaches the maximum and transparency.

Table 2

| Example | Wavelength (nm) | Transparency (%) |
|---|---|---|
| 2 | 440 | 75 |
| 3 | 450 | 76 |
| 4 | 460 | 83 |
| 5 | 490 | 84 |
| 6 | 590 | 77 |
| 7 | 650 | 73 |

COMPARATIVE EXAMPLES 1-4

$TiO_2$, Ag and $TiO_2$ were rf (radio frequency) sputtered in sequence from their respective targets on the surface of Pyrex glass at Ar gas atmosphere to obtain a laminate. Thickness of Ag film was maintained at 140 Å and thickness of titanium oxide thin films in the first layer and third layer was altered as shown in Table 3 below. Table 3 shows wavelengths at which the specimens obtained showed the maximum transparency. As is clear from the Table, in the variations of film thickness of the titanium oxide thin layers (it is film thickness in the third layer that mainly affects spectral characteristics), the changings of the color tone and of the selective transparency characteristics were extremely great in comparison with the composition using the titanium oxide film containing organic residues. For instance, as shown in Examples 2-7, the composition using the titanium oxide containing organic residues is bluish green and uniform in the color tone even if the film thickness of the titanium oxide layer varies in the order of 300 Å±50 Å and the selective transparency characteristics are not greatly affected. On the contrary, the compositions by the instant comparative examples causes great irregularities in the color tone like bluish green—yellow—reddish brown, and the selective transparency is greatly affected.

It is noticed from this that the laminates of the instant comparative examples are not preferred in comparison with the laminate using the titanium oxide layer containing organic residues for obtaining a laminate with optically homogeneous film stably formed on the substrate layer with a wide area or on long film.

Table 3

| Comparative Example No. | Film thickness of titanium oxide layer (Å) | | Wavelength at which to show the max. transparency (nm) |
|---|---|---|---|
| | First layer | Second layer | |
| 1 | 220 | 220 | 480 |
| 2 | 300 | 300 | 590 |
| 3 | 420 | 420 | 690 |
| 4 | 500 | 500 | 740 |

COMPARATIVE EXAMPLES 5-8

TiO, Ag and TiO were vapor-deposited in vacuo in sequence on the surface of Pyrex glass by resistance-heating of tungsten boat to obtain a laminate. At the time of vapor-evaporation of TiO, however, bell jar was once drawn to a vacuum degree of $5 \times 10^{-5}$ Torr. After that, $O_2$ gas with $1.5 \times 10^{-4}$ Torr. was introduced and at the same time, the substrate layer was held at 150° C. and reactive vapor-evaporation was effected to obtain titanium oxide film. Ag was vapor-deposited to 140 Å in thickness under vacuum of $5 \times 10^{-5}$ Torr. The film thickness of the titanium oxide thin film layers in the first layer and in the third layer was altered as indicated in Table 4 below. Table 4 shows wavelengths at which the specimens obtained showed the maximum transparency.

As is clear from this Table 4, with the laminates by the instant comparative examples, irregularity of the color tone and influences exerted on the selective transparency characteristics due to the changing of the film thickness are great in comparison with the laminate using the titanium oxide layer containing organic residues.

Furthermore, with the instant film great imbalance is caused in the optical characteristics of the film formed due to the fluctuations of the $O_2$ concentration and of the substrate temperature at the time of forming the film, and the instant film lacks stability.

Table 4

| Comparative Example No. | Film thickness of titanium oxide layer (Å) | | Wavelengths at which to show the max. transparency (nm) |
|---|---|---|---|
| | First layer | Third layer | |
| 5 | 220 | 220 | 470 |
| 6 | 300 | 300 | 550 |

Table 4-continued

| Comparative Example No. | Film thickness of titanium oxide layer (Å) First layer | Film thickness of titanium oxide layer (Å) Third layer | Wavelengths at which to show the max. transparency (nm) |
| --- | --- | --- | --- |
| 7 | 420 | 420 | 650 |
| 8 | 500 | 500 | 710 |

COMPARATIVE EXAMPLE 9

Comparisons of performances were made between the sample by Example 1 and the sample so prepared as to have the same composition as that in Comparative Example 1 by the magnetron type low temperature rf sputtering process by using, as the substrate film, the same film as that in Example 1. Results were shown in Table 5 below.

Table 5

| Sample | Amount of water deposited*1 (g/cm$^2$) | Adhesiveness*2 | Contact angle*3 (degree) | Peeling*4 Peeling stress (g/cm) | Peeling*4 Shifting to adhesive tape of Ag |
| --- | --- | --- | --- | --- | --- |
| Example 1 | $6.7 \times 10^{-3}$ | 100/100 | 31–37 | 600–650 | none |
| Comparative Example 9 | $9.5 \times 10^{-3}$ | 0/100 | 12–17 | 550–600 | yes |

*1Amount of water deposited:
Sample about 60 cm$^2$ in the area was held upright, sprayed with water at a distance of about 60 cm away. After spraying, the sample was quickly placed in the weighing bottle and covered. The amount of water deposited was determined from the difference in the weight between before and after spraying and the amount of water deposited was divided by the surface area to make the amount of water deposited per unit area.

*2Adhesiveness:
The respective samples were boiled in the boiling water for 45 minutes long. After that, the sample was taken out and put in between filter paper to take off water. The sample so treated was left to stand at room temperature for two hours and dried. Then, the surface of the sample was cross-cut in the checkerboard fashion at intervals of 1 mm by means of razor blade. Cellophane tape was placed by the application of pressure on the surface of these checkers. The cellophane tape was quickly peeled off. Thus, samples were compared in their adhesiveness. It was expressed by the numbers of checkers remaining unchanged after the peeling test with the initial checkers set at 100 (cross cut test).

*3Contact angle:
Immediately after prepared, the sample was stored in an N$_2$ atmosphere-substituted desiccator and by using this sample contact angle was measured at room temperature by means of contact angle-measuring device of Model CA-1 Contact angle-meter of Kyowa Kagaku Co., Ltd.

*4Peeling:
Polyester adhesive tape 0.9 cm wide and 2 cm long was attached to the surface of the sample. The adhesive tape was press-adhered under a load of 5 kg of a hard rubber roll 3 cm in diameter. After that, measurement was made by means of stress-measuring machine (Model TM-M measuring machine of Instron company) of stress requiring to peel off at the rate of 2 cm/min. with this adhesive tape being bent 180°. Furthermore, after this testing, observations were made of each of the adhesive tape surfaces peeled off to check on the presence or absence of the shifting toward the adhesive face of the adhesive tape after peeling of metal silver by means of the scanning type electron microscope (Model MSM-II of Hitachi Akashi).

EXAMPLE 8

The respective samples of Example 1 and Comparative Example 6 were irradiated in the coated surfaces for 10 hours by means of Xenon weather-ometer (Model XW-1 of Toyo Rika Kogyo Company). Results were shown in Table 6.

Table 6

| Sample | Infrared reflectivity (%) Before irradiation | Infrared reflectivity (%) After irradiation | Surface condition after irradiation |
| --- | --- | --- | --- |
| Example 1 | 98 | >80 | remained the same as before irradiation |
| Comparative Example 6 | 98 | 30 | Cracks occurred on the surface |

COMPARATIVE EXAMPLE 10

The surface of slide glass 1 mm thick was coated with a hexane solution (3% by weight) of a tetramer of tetrabutyl titanate to form film about 300 Å in thickness. After that, it was treated at 450° C. for one hour. Then silver was vapor-evaporated to about 160 Å in thickness. This silver film was so weak in the adhesiveness that it peeled off completely with ease only by rubbing with gauze.

EXAMPLE 9 AND COMPARATIVE EXAMPLE 11

There was prepared by following the same procedure as that of Example 1 a laminate with a titanium oxide layer 300 Å in thickness, as a first layer, a layer consisting of silver 160 Å in thickness, as a second layer, and a titanium oxide layer 320 Å in thickness, as a third layer, formed on OPP film (oriented polypropylene film) 50 μm in thickness. However, the drying temperature of tetrabutyl titanate was set at 90° C. or less. Likewise, there was prepared a laminate with a titanium oxide layer 300 Å in thickness, as a first layer, a layer consisting of silver 160 Å in thickness, as a second layer, and a titanium oxide layer 300 Å in thickness, as a third layer, formed on OPP film 50 μm in thickness. The first layer and the third layer were formed by magnetron type low temperature rf sputtering process with titanium oxide as target and the secnd layer by the vacuum-evaporation process as was the case with Example 1.

The surface of the both were once lightly wiped with gauze to compare their surface conditions. The sample prepared by the process of the present invention remained unchanged, but the sample prepared by the sputtering process was recognized to have greatly changed in the color tone due to the peeling of the surface.

EXAMPLES 10-12

There was obtained transparent, electrically conductive and selectively transparent film by following the same procedure as that of Example 1 except that film thickness in the silver thin layer was altered. Table 7 below shows thickness of the silver thin layer and characteristics of the film obtained.

Table 7

| Example | Film thickness in the silver thin layer (Å) | Photo permeability (%) | Surface resistance (Ω/square) | Infrared reflectivity (%) |
|---|---|---|---|---|
| 10 | 110 | 83 | 30 | 92 |
| 11 | 180 | 80 | 6 | 98 |
| 12 | 230 | 77 | 4 | 99 |

EXAMPLES 13-19

A transparent, electrically conductive and selectively transparent laminate was formed on the film by following the same procedure as that of Example 1 except that the silver thin layer was replaced by a thin layer of gold, of palladium, of copper and of aluminum.

Gold, palladium copper and aluminum were vacuum-evaporated in a vacuum degree of $2 \times 10^{-5}$ Torr. to provide a thin layer with film thickness as shown in Table 3. Characteristics of the film obtained were shown together in Table 8.

Table 8

| Example | Kind of metal | Film thickness (Å) | Transparency (%) | Infrared reflectivity (%) | Surface resistance (Ω/square) |
|---|---|---|---|---|---|
| 13 | Gold | 140 | 73 | 75 | 30 |
| 14 | Aluminum | 300 | 57 | 85 | 50 |
| 15 | " | 120 | 68 | — | $10^4$ |
| 16 | Copper | 220 | 74 | 72 | 30 |
| 17 | " | 90 | 87 | — | $10^7$ |
| 18 | Palladium | 80 | 65 | 45 | 60 |
| 19 | " | 40 | 80 | — | $10^4$ |

EXAMPLE 20

There were sequentially laminated on biaxially-stretched polyethylene terephthalate film 75 μm thick whose transparency was 86% a titanium oxide thin layer 300 Å in thickness as a first layer, a thin layer consisting of silver and copper 160 Å in thickness (9% by weight of copper and 91% by weight of silver) as a second layer and a titanium oxide layer 300 Å in thickness as a third layer to form on the film a laminate having transparent electrical conductivity and selective transparency.

The titanium oxide thin layers were each provided by coating by bar coater and heating at 110° C. for 5 minutes a solution comprising 3 parts of a tetramer of tetrabutyl titanate, 65 parts of isopropyl alcohol and 32 parts of normal hexane.

The unitary thin layer where silver and copper were made to coexist were provided by vacuum-depositing by the resistance-heating system using a silver-copper alloy (70% silver and 30% copper).

The total content of isopropyl groups and butyl groups contained in the titanium oxide thin layers in the first and in the third layers were 7.5% (determined by the mass fragmentgraphy on the ones with the mass numbers of 42 and 56).

Film obtained showed transparency of 84%, surface resistance of 12 Ω/square and infrared reflectivity of 97%.

EXAMPLES 21-29 AND COMPARATIVE EXAMPLES 12-16

There were obtained transparent, electrically conductive and selectively transparent laminates by altering the composition of the metal layer in the second layer as shown in Table 9. Other than the composition of the metal layer all remained quite the same as in the case of Example 1. The laminates so obtained were tested in their light resistance by means of Xenon weather-ometer (Model XW-1 of Toyo Rika Kogyo Company). The changing of light resistance was traced by the changing of infrared reflectivity, and it was determined by setting as the degrading time those hours spent until the point of time when the reflectivity reached 80% or less of the initial value. The polyester film face side was directed to the light source. Results were shown in Table 9. FIG. 1 is a graph in which they were plotted.

Table 9

| No. | Metal thin layer composition (Cu weight %) | Grading time (Hr) |
|---|---|---|
| Example 21 | 1 | 100 |
| " 22 | 2 | 800 |
| " 23 | 5.5 | >1000 |
| " 24 | 7.6 | >1000 |
| " 25 | 12 | >1000 |
| " 26 | 16 | >1000 |
| " 27 | 20 | >1000 |
| " 28 | 25 | 600 |
| " 29 | 30 | 120 |
| Comparative Example 12 | 0 | 10 |
| " 13 | 0.5 | 40 |
| " 14 | 36 | 90 |
| " 15 | 50 | 80 |
| " 16 | 70 | 40 |

EXAMPLE 30

A laminate was formed on biaxially-stretched polyethylene terephthalate film 75 μm in thickness whose transparency was 86% by following the same procedure as that of Example 1 except that the thin layer was formed by simultaneously evaporating silver and copper in a vacuum degree of $4 \times 10^{-5}$ Torr. from their respectively different evaporation sources. The composition ratio of silver to copper in the metal thin layer was 92%/8%. Film obtained showed transparency of 80% and infrared reflectivity of 92%.

EXAMPLE 31

A tetramer of tetrabutyl titanate was dissolved in normal hexane to make 3% by weight of solution. It was coated by means of spinner on the surface of polyethylene terephthalate film (75 μm thickness), polyimide film (KAPTON H film, product of du Pont, 50 μm) and slide glass 1 mm in thickness to form thin film 300 Å.

The substrate layers with thin film so formed were analyzed by following said analytical procedure to determine relations between residual amount of butyl groups contained in the respective layers and the drying conditions. Results were shown in Table 10.

Table 10

| Substrate material | Treating time | Room temperature | 60 | 120 | 180 | 300 | 450 |
|---|---|---|---|---|---|---|---|
| Polyethylene terephthalate film | 5 minutes | 28 | 12 | 2.0 | 0.5 | — | — |
| | 60 minutes | 13 | 5.4 | 0.9 | 0.6 | — | — |
| Polyimide film | 5 minutes | — | — | — | 0.8 | 0.1 | — |
| | 60 minutes | — | — | — | 0.6 | 0.1 | — |
| Glass plate | 5 minutes | — | — | — | — | 0.3 | 0.1 or less |
| | 60 minutes | — | — | — | — | 0.2 | 0.1 or less |

EXAMPLES 32–37

There was obtained transparent, electrically conductive and selectively transparent film by following the same procedure as that of Example 1 except that tetrabutyl titanate was replaced respectively by mixtures of 4 parts of tetrapropyl titanate; tetrastearyl titanate; tetrabutyl titanate and 1 part of tetrapropyl titanate; a mixture of 19 parts of tetrabutyl tetanate and 1 part of tetrastearyl titanate; a decamer of tetrabutyl titanate; and a monomer of tetrabutyl titanate. They showed transparency of 81%, 78%, 82%, 80%, 81% and 81%, respectively. Infrared reflectivity was 96% in either instance, and surface resistance was 18–20 Ω/square in either instances.

EXAMPLE 38

A laminate with the same film thickness composition as that of Example 1 was formed on the same polyethylene terephthalate film as that of Example 1. However, the titanium oxide thin layers were each provided by coating by bar coater and heating at 130° C. for 5 minutes 3% by weight of solution of isopropyl alcohol with addition of 3 parts of a tetramer of tetrabutyl titanate and a 2 mole-fold amount, based on the titanium atom, of acetyl acetone. Film obtained was 80% in the transparency, 15 Ω/square in the surface resistance and 96% in the infrared reflectivity.

What I claim is:

1. A transparent, electrically conductive laminated structure comprising:
    (A) a transparent solid substrate,
    (B) a thin layer of an oxide of titanium in contact with the said substrate,
    (C) a thin layer of an electrically conductive metal in contact with the said layer (B),
    (D) a thin layer of an oxide of titanium in contact with the said layer (C), and
    (E) with or without a transparent top layer in contact with the said layer (D), wherein:
    (i) the said substrate (A) is a film-forming synthetic resin layer and
    (ii) the said layer (B) is a layer of an oxide of titanium derived from a layer of an organic titanium compound and contains organic residual moieties of the said organic titanium compound, the amount of said organic residual moieties being 0.1–30% by weight based on the weight of the said layer (B).

2. A laminated structure described in claim 1 in which (iii) the said layer (D) is a layer of an oxide of titanium derived from a layer of an organic titanium compound and contains organic residual moieties of the said organic titanium compound.

3. A laminated structure described in claim 1 in which the layer having the said organic residual moiety is a layer of an oxide of titanium derived from a layer of alkyl titanate having $C_1$–$C_{20}$ alkyl groups.

4. A laminated structure described in claim 1 in which the metal of the said layer (C) is at least one member of metals selected from the group consisting of Ag and Cu.

5. A laminated structure described in claim 4 in which the metal of the said layer (C) consists of Ag and Cu with the content of the said Cu being 1–30% by weight based on the total of Ag and Cu.

6. A laminated structure described in claim 1 in which the said substrate (A) is a polyester layer which is 80% or more in the visible light transparency and 6–250 μm in film thickness.

7. A laminated structure described in claim 1 in which the said layer (B) is 50–1000 Å in film thickness.

8. A laminated structure described in claim 1 in which the said layer (C) is 50–600 Å in film thickness.

9. A laminated structure described in claim 1 in which the said layer (D) is 50–1000 Å in film thickness.

10. A process for the production of a transparent, electrically conductive laminated structure described in claim 1 which comprises following steps (1)–(4):
    (1) Coating the surface of a transparent solid substrate of a film-forming resin with a solution of an organic titanium compound in solvent:
    (2) Drying the said coated layer obtained in the said step (1) in such a manner as to hydrolyze a part of the organic moieties of the organic titanium compounds the amount of residual moieties being 0.1 to 30% by weight based on the weight of the dried coated layer:
    (3) Forming a thin layer of an electrically conductive metal on the said dried layer of the oxide of titanium containing organic residual moieties formed in the said step (2):
    (4) Forming a layer of an oxide of titanium on the said thin layer of the electrically conductive metal formed in the said step (3), with or without
    (5) Forming a transparent top layer on the said layer obtained in the said step (4), and
    said film forming resin of step (1) being capable of withstanding the drying temperature of step (2).

11. A process described in claim 10 in which the said step (4) is conducted by similar means to that of the said step (1) and step (2).

* * * * *